(12) United States Patent
Yamasaki et al.

(10) Patent No.: US 10,020,364 B2
(45) Date of Patent: Jul. 10, 2018

(54) NONVOLATILE SEMICONDUCTOR MEMORY DEVICE AND METHOD OF MANUFACTURING THE SAME

(71) Applicant: Toshiba Memory Corporation, Minato-ku (JP)

(72) Inventors: Hiroyuki Yamasaki, Chiba (JP); Makoto Fujiwara, Yokkaichi (JP); Shinji Mori, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/849,748

(22) Filed: Sep. 10, 2015

(65) Prior Publication Data
US 2016/0268379 A1 Sep. 15, 2016

Related U.S. Application Data

(60) Provisional application No. 62/132,247, filed on Mar. 12, 2015.

(51) Int. Cl.
*H01L 27/115* (2017.01)
*H01L 29/788* (2006.01)
(Continued)

(52) U.S. Cl.
CPC .... *H01L 29/1054* (2013.01); *H01L 21/28282* (2013.01); *H01L 21/324* (2013.01); *H01L 27/11582* (2013.01)

(58) Field of Classification Search
CPC ........... H01L 27/11582; H01L 27/1157; H01L 21/28282; H01L 27/11568; H01L 29/513;
(Continued)

(56) References Cited

U.S. PATENT DOCUMENTS 7,875,922 B2    1/2011    Arai et al.
8,350,314 B2    1/2013    Fukuzumi et al.
(Continued)

FOREIGN PATENT DOCUMENTS

JP    2008-159699    7/2008
JP    2009-135328    6/2009
JP    2011-198963    10/2011

*Primary Examiner* — Mary Wilczewski
*Assistant Examiner* — Tsz Chiu
(74) *Attorney, Agent, or Firm* — Oblon, McClelland, Maier & Neustadt, L.L.P.

(57) ABSTRACT

One embodiment includes: forming a laminated body by alternately laminating a conducting layer and an interlayer insulating layer on a substrate; forming a memory hole passing through the laminated body; forming a memory gate insulating layer including a charge storage layer on an inner wall of the memory hole; forming a first semiconductor layer on the memory gate insulating layer; forming a cover film on the first semiconductor layer; removing the memory gate insulating layer, the first semiconductor layer, and the cover film on a bottom surface of the memory hole, to expose the substrate; forming an epitaxial layer on the exposed substrate; removing the cover film; and forming the second semiconductor layer along the first semiconductor layer, to electrically couple: the substrate to the first semiconductor layer; and the substrate to the second semiconductor layer, via the epitaxial layer.

5 Claims, 10 Drawing Sheets

(51) Int. Cl.
  *H01L 29/792* (2006.01)
  *H01L 21/336* (2006.01)
  *H01L 29/10* (2006.01)
  *H01L 27/11582* (2017.01)
  *H01L 21/324* (2006.01)
  *H01L 21/28* (2006.01)

(58) Field of Classification Search
  CPC ............... H01L 29/792; H01L 29/7926; H01L 27/11524; H01L 27/11565; H01L 29/7881; H01L 27/11556; H01L 27/11578; H01L 27/11551; H01L 27/11521; G11C 16/04831; G11C 17/1231; G11C 2213/751
  See application file for complete search history.

(56) References Cited

U.S. PATENT DOCUMENTS

| | | | |
|---|---|---|---|
| 9,076,879 B2* | 7/2015 | Yoo | H01L 27/1157 |
| 2008/0157092 A1* | 7/2008 | Arai | H01L 27/115 |
| | | | 257/67 |
| 2009/0310415 A1* | 12/2009 | Jin | H01L 27/11519 |
| | | | 365/185.17 |
| 2010/0034028 A1* | 2/2010 | Katsumata | G11C 11/5671 |
| | | | 365/185.28 |
| 2010/0038699 A1* | 2/2010 | Katsumata | H01L 27/11578 |
| | | | 257/324 |
| 2010/0072538 A1* | 3/2010 | Kito | H01L 27/11578 |
| | | | 257/326 |
| 2010/0270593 A1* | 10/2010 | Lung | H01L 27/101 |
| | | | 257/208 |
| 2011/0018047 A1* | 1/2011 | Komiya | H01L 27/11521 |
| | | | 257/315 |
| 2011/0115014 A1* | 5/2011 | Ichinose | H01L 27/11578 |
| | | | 257/324 |
| 2011/0233644 A1* | 9/2011 | Fukuzumi | H01L 21/28282 |
| | | | 257/324 |
| 2012/0049268 A1* | 3/2012 | Chang, II | H01L 21/28273 |
| | | | 257/324 |
| 2012/0228697 A1* | 9/2012 | Youm | H01L 29/7926 |
| | | | 257/329 |
| 2014/0070302 A1* | 3/2014 | Yoo | H01L 27/1157 |
| | | | 257/324 |
| 2016/0064409 A1* | 3/2016 | Yaegashi | H01L 27/11582 |
| | | | 257/325 |

* cited by examiner

NONVOLATILE SEMICONDUCTOR MEMORY DEVICE AND METHOD OF MANUFACTURING THE SAME

CROSS REFERENCE TO RELATED APPLICATION

This application is based upon and claims the benefit of priority from U.S. Provisional Patent Application No. 62/132,247, filed on Mar. 12, 2015, the entire contents of which are incorporated herein by reference.

FIELD

Embodiments described herein relate generally to a nonvolatile semiconductor memory device and a method of manufacturing the nonvolatile semiconductor memory device.

BACKGROUND

Recently, in the field of NAND-type flash memories, attention has been focused on a laminated-type (three-dimensional) NAND-type flash memory as a device that can achieve high integration without being restricted by the limit of resolution of the lithography technology. This type of three-dimensional NAND-type flash memory includes a laminated body and a columnar semiconductor layer. In the laminated body, a plurality of conductive films and interlayer insulating films are alternately laminated on a substrate. The conductive films function as word lines and selection gate lines. The semiconductor layer is formed to pass through these laminated films. This semiconductor layer functions as a body of a memory string. Between the semiconductor layer and the conductive film, a memory gate insulating layer that includes at least a charge storage layer is formed.

In this three-dimensional NAND-type flash memory, the ON/OFF characteristics (selection characteristics) of selection transistors are important, and it is necessary to cause a flow of a sufficient cell current during selection.

DETAILED DESCRIPTION

A nonvolatile semiconductor memory device according to embodiments described below includes a memory cell array and a wiring portion. The memory cell array includes: a memory string where a plurality of memory cells is series-coupled together; and a selection transistor coupled to one end of the memory string. The wiring portion is formed by alternately laminating a conducting layer and an interlayer insulating layer on a substrate over a plurality of layers. The conducting layers function as gate electrodes for the memory cells and the selection transistors. One of the selection transistors includes a plurality of the conducting layers, and the plurality of the conducting layers are coupled in common to a common contact.

The following describes nonvolatile semiconductor memory devices according to embodiments in detail with reference to the accompanying drawings. Here, these embodiments are only examples, and are not described for the purpose of limiting the present invention. The respective drawings of the nonvolatile semiconductor memory devices used in the following embodiments are schematically illustrated. The thickness, the width, the ratio, and similar parameter of the layer are different from actual parameters.

The following embodiments relate to a nonvolatile semiconductor memory device in a structure where a plurality of metal-oxide-nitride-oxide-semiconductor (MONOS) type memory cells (transistors) is disposed in a height direction. The MONOS type memory cell includes: a semiconductor layer disposed in a columnar shape vertical to the substrate as a channel, and a gate electrode layer disposed on the side surface of the semiconductor layer via a charge storage layer. However, this is not also intended to limit the present invention. The present invention is applicable to another type of charge storage layer, for example, a semiconductor-oxide-nitride-oxide-semiconductor type (SONOS) memory cell or a floating-gate type memory cell.

[Configuration of Nonvolatile Semiconductor Memory Device]

Figure 1:
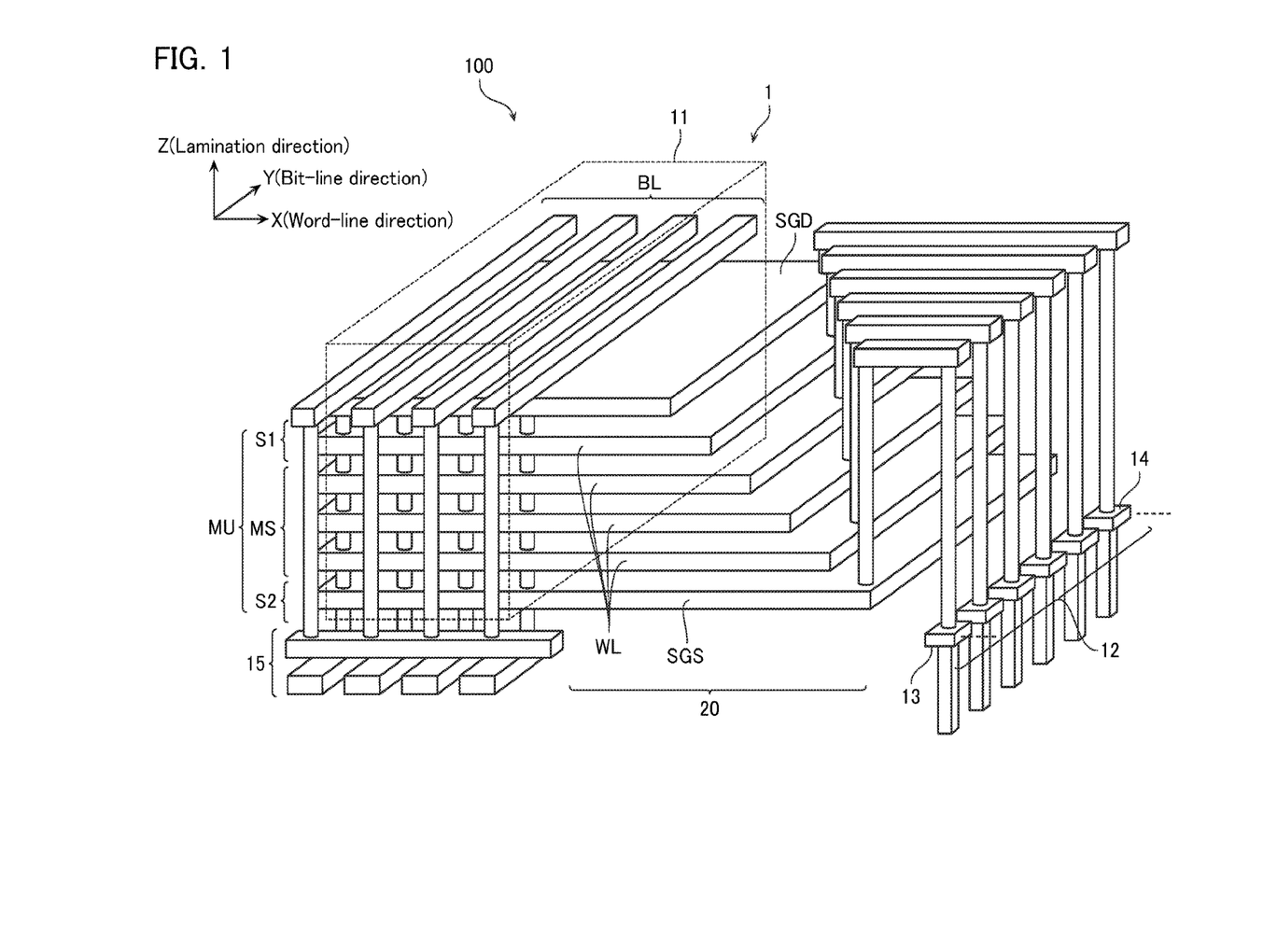
FIG. 1 is a perspective view schematically illustrating one example of the structure a nonvolatile semiconductor memory device 100 according to an embodiment.

FIG. 1 is a perspective view schematically illustrating an exemplary structure of a nonvolatile semiconductor memory device 100 of an embodiment. The nonvolatile semiconductor memory device 100 includes a memory cell array 11, word-line driving circuits 12, source-side selection-gate-line driving circuits 13, drain-side selection-gate-line driving circuits 14, a sense amplifier 15, word lines WL, source-side selection gate lines SGS, drain-side selection gate lines SGD, bit lines BL, a word-line wiring portion, and similar portion.

The memory cell array 11 includes memory strings MS, drain-side selection transistors S1, and source-side selection transistors S2 on a semiconductor substrate (not illustrated in FIG. 1). The memory string MS is constituted such that a plurality of memory cells MC (memory transistors) are coupled together in series. The respective drain-side selection transistor 51 and source-side selection transistor S2 are coupled to both ends of the memory string MS. Here, the memory string MS, and the drain-side selection transistor S1 and the source-side selection transistor S2 coupled to both ends of the memory string MS are hereinafter referred to as a "NAND cell unit NU."

As described later, the memory cell MC has the structure where a control gate electrode (word line) is disposed on the side surface of a columnar semiconductor film which becomes a channel via a memory layer including a charge storage layer. The drain-side selection transistor and the source-side selection transistor each have the structure where a selection gate electrode (selection gate line) is disposed on the side surface of a columnar semiconductor film via the memory layer including a charge storage layer. For simplification of the illustration, FIG. 1 illustrates the case where four memory cells MC are disposed in one memory string MS as the example. Obviously, the number of the memory cells MC in one memory string MS is not limited to this.

The word line WL is coupled in common to the adjacent memory cells along the X direction (the word-line direction) in FIG. 1. The source-side selection gate line SGS is coupled in common to the adjacent source-side selection transistors S2 along the word-line direction. The drain-side selection gate line SGD is coupled in common to the adjacent drain-side selection transistor S1 along the word-line direction. Here, in the following description, the source-side selection gate line SGS and the drain-side selection gate line SGD are collectively referred to simply as "selection gate lines" in some cases. The drain-side selection transistor and the source-side selection transistor are collectively referred to simply as "selection transistors" in some cases. Here, in the memory cells MC in the memory string MS, one or a plurality of the memory cells MC close to the source-side selection gate line SGS and the drain-side selection gate line SGD might be treated as a dummy cell that is not used for data storage. Also in the example described as follows, a description will be given of the example where one dummy cell is disposed at each of both ends of the memory string MS. This, however, should not be construed in a limiting sense. Two or more dummy cells may be disposed or the dummy cell may be omitted.

Furthermore, the bit lines BL are disposed to extend having the longitudinal direction in the Y direction (the bit-line direction) intersecting with the X direction (the word-line direction), and are collocated at a predetermined pitch in the X direction. The bit line BL is coupled to a plurality of the memory strings MS via the drain-side selection transistors S1. Source lines SL, which are omitted in FIG. 1, are disposed having the longitudinal direction, for example, in the Y direction and coupled to the memory strings MS via the source-side selection transistors S2.

The word-line driving circuit 12 is a circuit that controls the voltage to be applied to the word line WL. The source-side selection-gate-line driving circuit 13 is a circuit that controls the voltage to be applied to the source-side selection gate line SGS. The drain-side selection-gate-line driving circuit 14 is a circuit that controls the voltage to be applied to the drain-side selection gate line SGD. The sense amplifier 15 is a circuit for amplifying a signal (voltage) read out from a selected memory cell to the bit line BL.

A wiring portion 20 is a wiring portion for coupling the word lines WL and the selection gate lines SGD and SGS to the contacts. The word lines WL, the selection gate lines SGS and SGD have a structure processed in a staircase pattern such that the respective upper portions can independently be coupled to the contacts.

Figure 2:
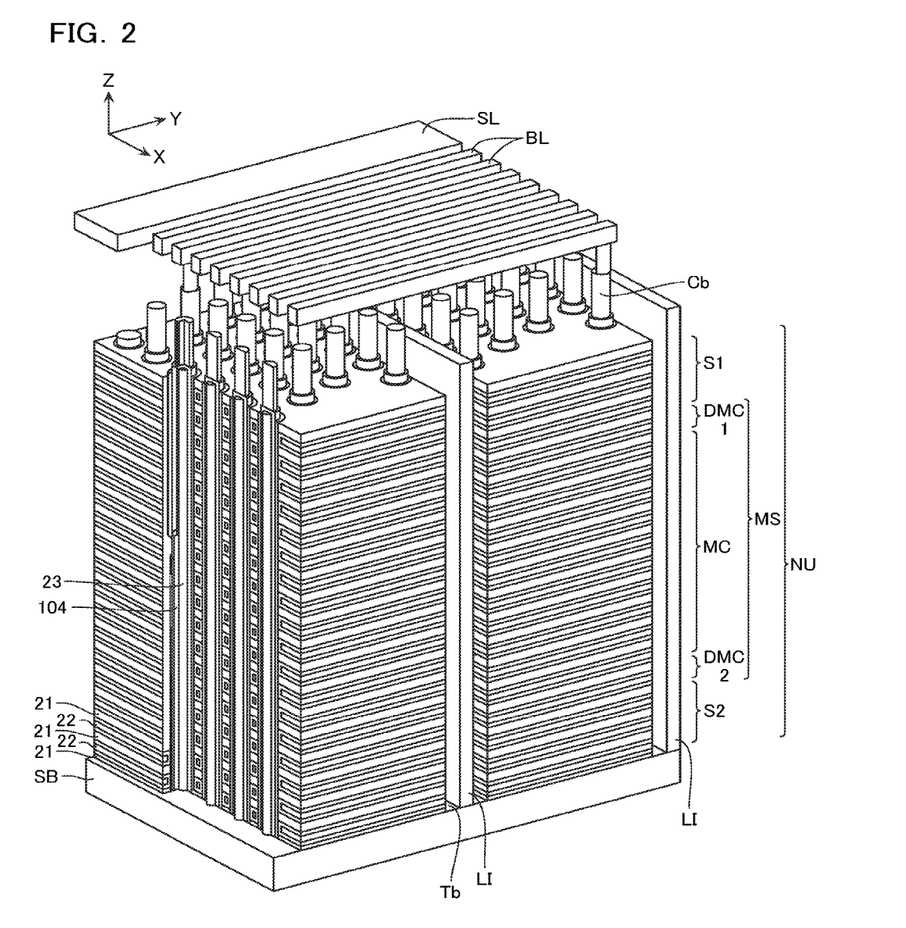
FIG. 2 is a perspective view illustrating the structure of a part of memory cell arrays 11.
Figure 3:
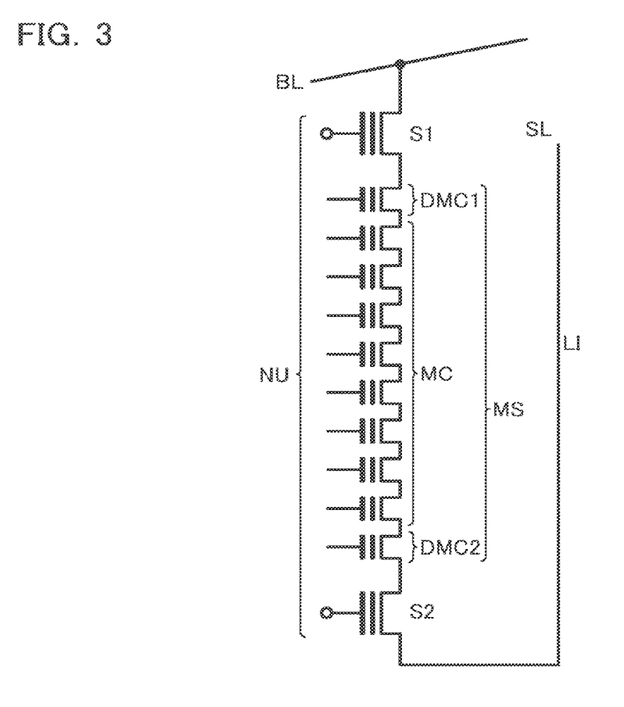
FIG. 3 is an equivalent circuit diagram of one NAND cell unit NU.
Figure 4:
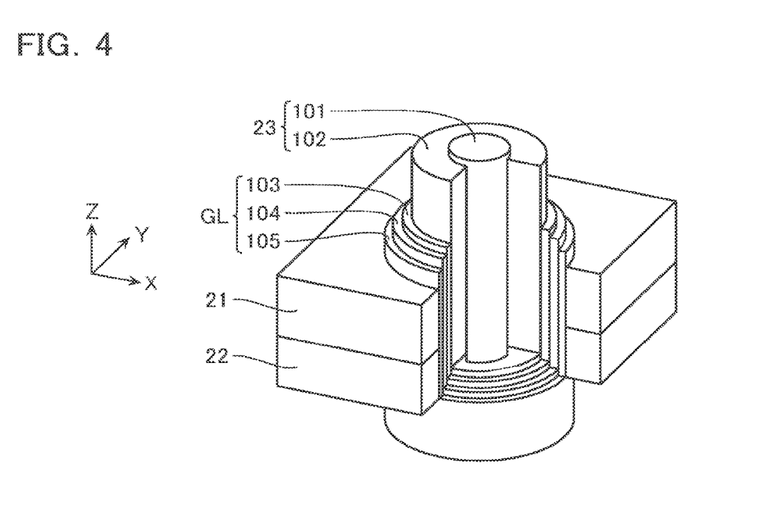
FIG. 4 is a cross-sectional perspective view of one memory cell MC.

The following describes the detail of the structure of the memory cell array 11 with reference to FIG. 2 to FIG. 4. FIG. 2 is a perspective view illustrating the structure of a part of the memory cell array 11. FIG. 3 is an equivalent circuit diagram of one NAND cell unit NU. FIG. 4 is a cross-sectional perspective view of one memory cell MC and similar member.

As illustrated in FIG. 2, the memory cell array 11 has the structure where interlayer insulating films 21 and conductive films 22 are alternately laminated on a semiconductor substrate SB. This conductive film 22 functions as the control gate (word line WL) of the memory cell MC, the source-side selection gate line SGS, and the drain-side selection gate line SGD. The interlayer insulating film 21 is disposed in the up-and-down direction of the conductive film 22 and electrically insulates the conductive films 22 from one another.

The conductive film 22 can be formed of, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chrome silicide (CrSix), manganese silicide (MnSix), iron silicide (FeSix), ruthenium (Ru), molybdenum (Mo), titanium (Ti), titanium nitride (TiN), vanadium (V), chrome (Cr), manganese (Mn), iron (Fe), cobalt (Co), nickel (Ni), gold (Au), silver (Ag) or copper (Cu), or can be formed of a compound of these materials. The conductive film 22 may be formed of polysilicon with the addition of impurities.

To pass through this laminated body of the interlayer insulating film 21 and the conductive film 22, semiconductor layers 23 having the longitudinal direction in the lamination direction (the Z direction in FIG. 2) are disposed at a predetermined pitch in the XY plane. Between: the semiconductor layer 23; and the laminated body of the conductive film 22 and the interlayer insulating film 21, a memory layer 104 including a charge storage layer is formed. The memory layer 104 can be formed in a laminated structure of: a charge storage layer such as a silicon nitride film, and an oxide film such as a silicon oxide film. Depending on the storage amount of the electric charge to this charge storage layer, the threshold voltage of the memory cell MC changes. The memory cell MC holds data corresponding to this threshold voltage.

The semiconductor layers 23 function as the channel regions (bodies) of the memory cell MC, the dummy cells DMC1 and DMC2, and the selection transistors S1 and S2 that are included in the NAND cell unit NU. These semiconductor layers 23 are coupled, on their upper ends, to the bit lines BL via contacts Cb. The bit lines BL having the longitudinal direction in the Y direction are collocated at a predetermined pitch along the X direction.

The lower end of the semiconductor layer 23 is coupled to the semiconductor substrate SB. As described later, the lower end of the semiconductor layer 23 is coupled to the source line SL via this semiconductor substrate SB and a source contact LI, which is described later. The source lines SL are collocated while having their longitudinal directions in the Y direction, similarly to the bit lines BL.

Here, the laminated body of the interlayer insulating film 21 and the conductive film 22 in the memory cell array 11 is separated into blocks as the smallest unit of data erasure. At the boundary of the separation, a trench Tb is formed. In this trench Tb, an interlayer insulating film (not illustrated) is implanted. Further, the source contact LI described above is formed passing through the interlayer insulating film. This source contact LI has a lower end coupled to the semiconductor substrate SB while having an upper end coupled to the source line SL.

FIG. 3 is an equivalent circuit diagram of one NAND cell unit NU. In this memory cell array 11, the one NAND cell unit includes the memory string MS, the drain-side selection transistor S1, and the source-side selection transistor S2. The memory string MS is constituted of a plurality of the memory cells MC and dummy cells DMC1 and DMC2. The drain-side selection transistor S1 is coupled between the upper end of the memory string MS and the bit line BL. The source-side selection transistor S2 is coupled between the lower end of the memory string MS and the source line SL.

FIG. 4 illustrates one example of a specific structure of one of the memory cell MC and the dummy cell DMC. The semiconductor layer 23 includes an oxide-film core 101 and a semiconductor portion (semiconductor columnar portion) 102 in a columnar shape, which surrounds the oxide-film core 101. The oxide-film core 101 is formed of, for example, a silicon oxide film ($SiO_2$). The semiconductor columnar portion 102 is formed of, for example, silicon (Si), silicon-germanium (SiGe), silicon carbide (SiC), germanium (Ge), or carbon (C), and can be formed of a single layer or two layers.

In the peripheral area of this semiconductor columnar portion 102, a tunnel insulating layer 103, the memory layer 104 including the charge storage layer, and a block insulating layer 105 are formed to surround the semiconductor columnar portion 102. The tunnel insulating layer 103 is constituted of, for example, a silicon oxide film (SiOx), and functions as the tunnel insulating layer of the memory cell MC or the dummy cell DMC. The memory layer 104 includes, for example, a silicon nitride film (SiN), and has a function that traps electrons injected from the semiconductor columnar portion 102 via the tunnel insulating layer 103 by a write operation. The block insulating layer 105 can be formed of, for example, a silicon oxide film.

The tunnel insulating layer 103, the memory layer 104, and the block insulating layer 105 described above are collectively referred to as a memory gate insulating layer GL. In the case of FIG. 4, the memory gate insulating layer GL is expressed by three layers. The memory gate insulating layer GL can employ various structures with different count, order, materials, or similar parameter of the layers, but includes at least the charge storage layer described above.

Here, the materials of the tunnel insulating layer 103 and the block insulating layer 105 can employ, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO other than the silicon oxide film (SiOx).

In this example, the tunnel insulating layer 103, the memory layer 104, and the block insulating layer 105 are illustrated to be formed in the whole region of the side surface of the semiconductor columnar portion 102. This, however, should not be construed in a limiting sense. These members can be formed only in the portion in the semiconductor columnar portion 102 facing the side surface of the word line WL.

In the peripheral area of the semiconductor columnar portion 102, the interlayer insulating film 21 described above and a tungsten electrode, which functions as the conductive film 22, are alternately laminated via the memory gate insulating layer GL to surround the semiconductor columnar portion 102.

Figure 5:
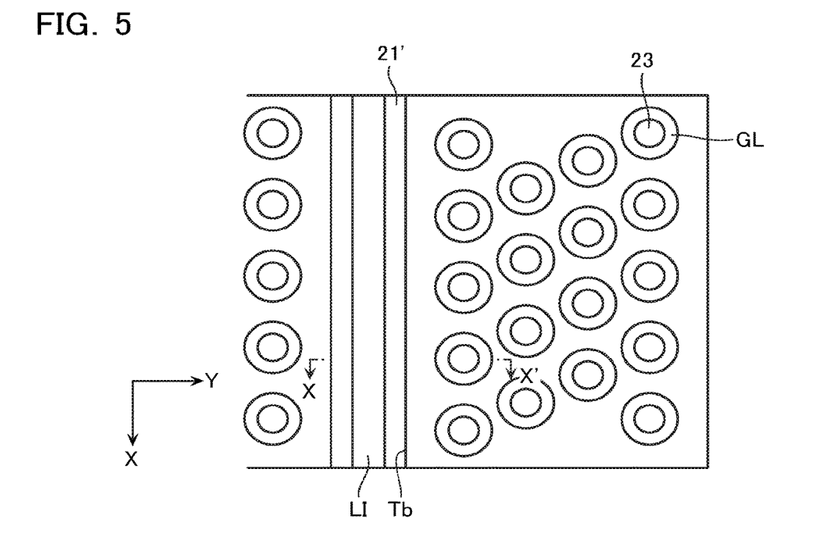
FIG. 5 is a plan view of a part of the memory cell array 11.

Regarding these memory cells MC, as illustrated in FIG. 5, which is a plan view of a part of the memory cell array 11, the semiconductor layers 23 (including the semiconductor columnar portion 102) are arrayed in one row in the oblique direction with respect to the X direction (the word-line direction) and the Y direction (the bit-line direction). This increases the array density of the semiconductor layer 23, thus increasing the array density of the memory cell MC. However, this is only one example, and the semiconductor layers 23 can be disposed along the X direction and the Y direction. The source contact LI is formed in a stripe shape to have the longitudinal direction in the X direction, and is implanted in the trench Tb via an interlayer insulating film 21'.

Figure 6:
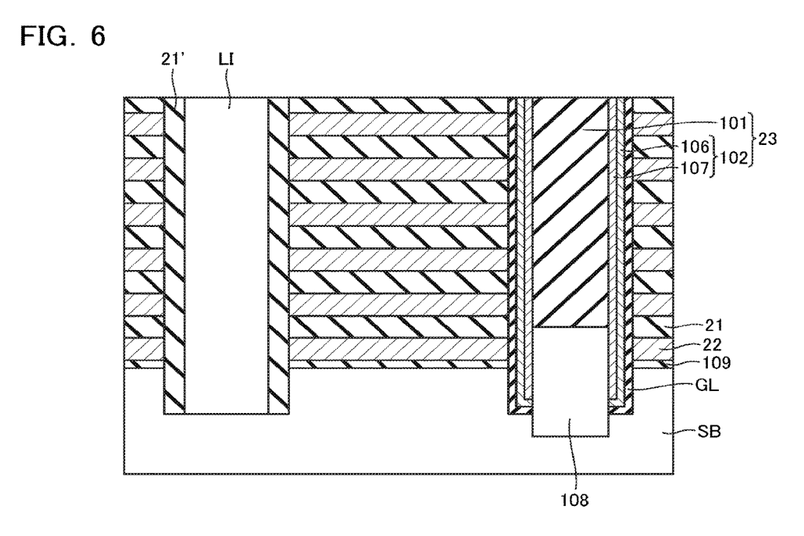
FIG. 6 is a cross-sectional view (a cross-sectional view along the X-X' direction of FIG. 5) along the part of the memory cell array 11 in the Y direction.

FIG. 6 is an X-X' cross-sectional view of FIG. 5, and a cross-sectional view including the memory cell MC and the source contact LI. On the semiconductor substrate SB having the surface where a gate insulating film 109 is formed, the semiconductor columnar portion 102 is formed to extend in the vertical direction with respect to the substrate SB. On the side surface of the semiconductor columnar portion 102, the memory gate insulating layer GL, which includes the charge storage film, is formed. Furthermore, in the peripheral area of the semiconductor columnar portion 102, the conductive films 22 and the interlayer insulating films 21 are alternately laminated on the substrate SB via the memory gate insulating layer GL. At the inner side of the semiconductor columnar portion 102, an epitaxial layer 108 is formed to have a lower end positioned under the lower end of the semiconductor layers 23 and the lower end of the memory gate insulating layer GL. In other words, the lower end of the epitaxial layer 108 is positioned under the surface of the substrate SB, and the lower end of the semiconductor layers 23 and the lower end of the memory gate insulating layer GL are positioned between the surface of the substrate SB and the lower end of the epitaxial layer 108. This epitaxial layer 108 can be formed by an epitaxy method (homoepitaxy) using the substrate SB as a foundation layer. The formation can be performed also by the epitaxy method (heteroepitaxy) using material different from that of the substrate SB. In the case of heteroepitaxy, a buffer layer (not illustrated) can be arranged between the epitaxial layer 108 and the substrate SB. As just described, the epitaxial layer 108 is electrically coupled to each of the substrate SB and the semiconductor columnar portion 102. This consequently achieves an electrical contact between the semiconductor columnar portion 102 and the substrate SB.

The semiconductor columnar portion 102 includes a first semiconductor layer 106, which is formed at the inner side of the memory gate insulating layer GL, and a second semiconductor layer 107, which is formed at the inner side of the first semiconductor layer 106. At the inner side of the semiconductor portion 102 in a columnar shape, the oxide-film core 101 is formed. The above-described source contact LI is implanted in the trench Tb, which divides the memory cell array 11 by blocks, via the interlayer insulating film 21'. The memory gate insulating layer GL, the semiconductor columnar portion 102, and the source contact LI are formed in contact with the diffusion layer (not illustrated), which is formed on the surface of the substrate SB, but can be formed such that their lower ends are positioned inside the substrate SB as illustrated in FIG. 6 due to slight difference in manufacturing. However, the configuration is not limited to this configuration in this drawing, and the formation may be performed such that the respective lower ends are formed to be positioned approximately on the identical plane as the surface of the substrate SB.

The first semiconductor layer 106 and the second semiconductor layer 107, which constitute the semiconductor columnar portion 102, can be formed as a single crystal or a polycrystal by a solid phase growth method or a vapor growth method using, for example, silicon or silicon-germanium. This point will be described in detail later.

[Method of Manufacturing Memory Cell MC]

The following describes a method of manufacturing the memory cell MC with reference to FIG. 7 to FIG. 15.

Figure 7:
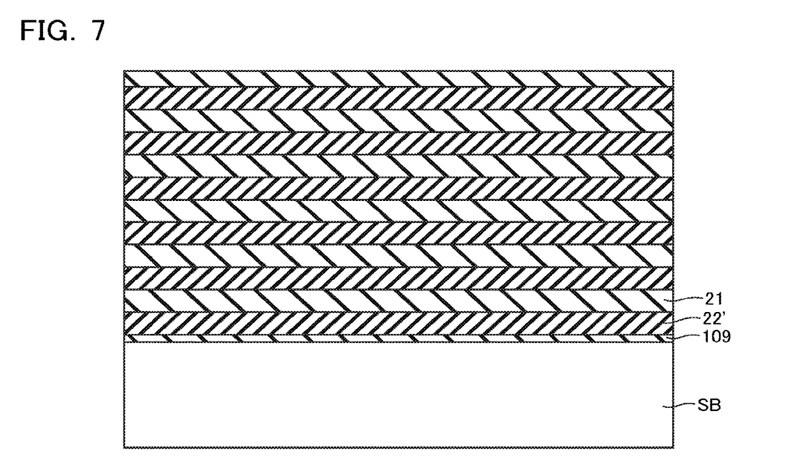
FIG. 7 is a process diagram illustrating a method of manufacturing the memory cell MC.
Figure 8:
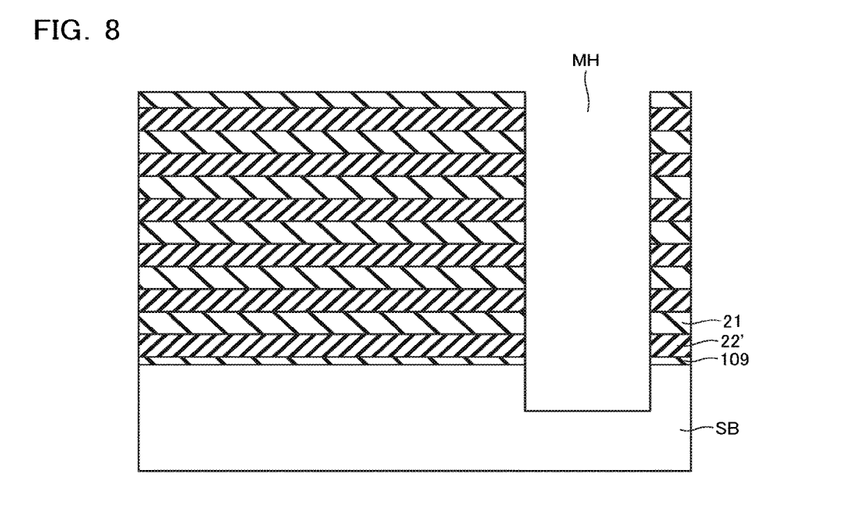
FIG. 8 is a process diagram illustrating the method of manufacturing the memory cell MC.

Firstly, as illustrated in FIG. 7, the gate insulating film 109, which is formed of a silicon oxide film or similar film, is formed on the substrate SB, which is made of silicon or similar material. Then, a sacrifice film 22', which is formed of a silicon nitride film, and the interlayer insulating film 21, which is formed of, for example, a silicon oxide film, are alternately laminated to form a laminated body. Subsequently, as illustrated in FIG. 8, a memory hole MH, which passes through the laminated body and the gate insulating film 109, is formed by etching such as RIE. At the time of formation of this memory hole MH, when the memory hole MH is formed to have the bottom surface positioned above the top surface of the substrate SB, it becomes impossible to ensure the conduction between the semiconductor layer, which is formed within the memory hole MH, and the substrate SB. This might cause deterioration in cell characteristics. Therefore, as illustrated in FIG. 8, the bottom surface of the memory hole MH is formed to be positioned under the surface of the substrate SB. That is, the memory hole MH is formed by etching not only the laminated body of the conductive films 22 and the interlayer insulating films 21 and the gate insulating film 109, but also the substrate SB during etching. However, the memory hole MH does not necessarily need to be formed to have the lower end positioned under the top surface of the substrate SB. The semiconductor layer and similar member formed inside the memory hole MH only need to completely face at least the conductive film close to the substrate surface in the laminated body of the conductive films 22 and the interlayer insulating films 21. Accordingly, the lower end of the memory hole MH only needs to be positioned at least under the top surface of the gate insulating film 109, which is formed on the surface of the substrate SB.

Figure 9:
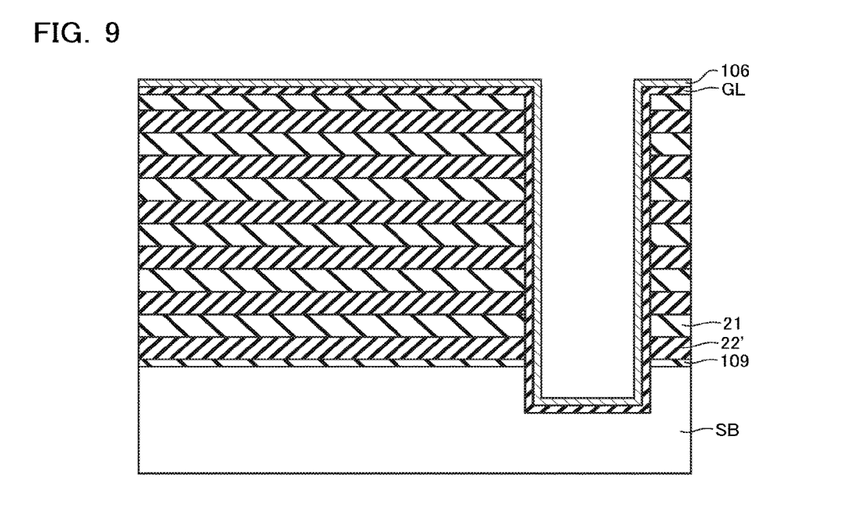
FIG. 9 is a process diagram illustrating the method of manufacturing the memory cell MC.
Figure 10:
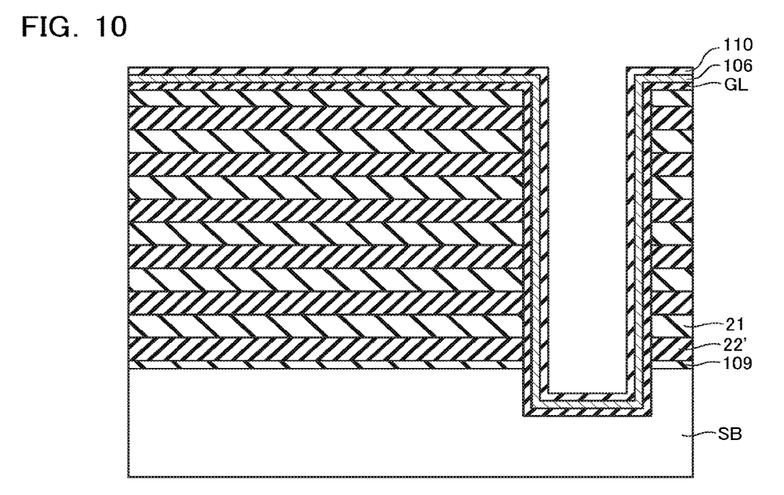
FIG. 10 is a process diagram illustrating the method of manufacturing the memory cell MC.
Figure 11:
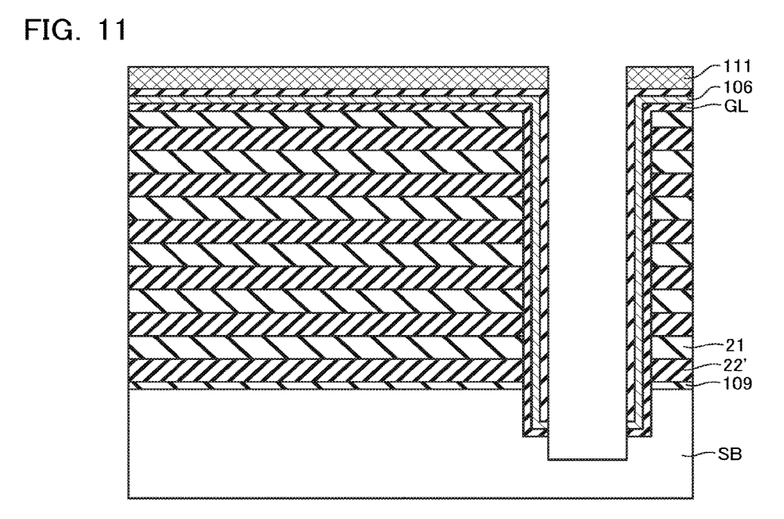
FIG. 11 is a process diagram illustrating the method of manufacturing the memory cell MC.

Subsequently, as illustrated in FIG. 9, the block insulating layer 105, the memory layer 104, and the tunnel insulating layer 103 described above are deposited on the inner wall of the memory hole MH by a CVD method or similar method, so as to form the memory gate insulating layer GL. Further, on that surface, the first semiconductor layer 106, which is made of non-doped amorphous silicon or polysilicon, is formed. As described above, the bottom surface of the memory hole MH is positioned under the top surface of the substrate SB. Accordingly, the lower end of the memory gate insulating layer GL, which is formed on the inner wall of the memory hole MH, and the lower end of the first semiconductor layer 106 are also positioned under the top surface of the substrate SB. The materials of the block insulating layer 105, the memory layer 104, and the tunnel insulating layer 103 included in the memory gate insulating layer GL can preferably employ the above-described materials. As illustrated in FIG. 10, a cover film 110 is formed to cover the first semiconductor layer 106. Here, this cover film 110 is not limited to a film formed using a film formation process (deposition), and can employ a film (including a chemical oxide film generated by treatment other than wet treatment) generated by oxidizing the surface of the first semiconductor layer 106 by wet treatment using a chemical liquid or similar treatment. Subsequently, as illustrated in FIG. 11, a mask material 111 is formed in the region where the memory hole MIT is not formed. The memory gate insulating layer GL, the first semiconductor layer 106, and the cover film 110 on the bottom surface of the memory hole MH are removed by etching, so as to expose the substrate SB. As just described, disposing the cover film 110 before etching the bottom surface of the memory hole MH allows preventing the first semiconductor layer 106 from being damaged during etching. Here, the material of the cover film 110 can employ, for example, a silicon oxide film or a silicon nitride film.

Figure 12:
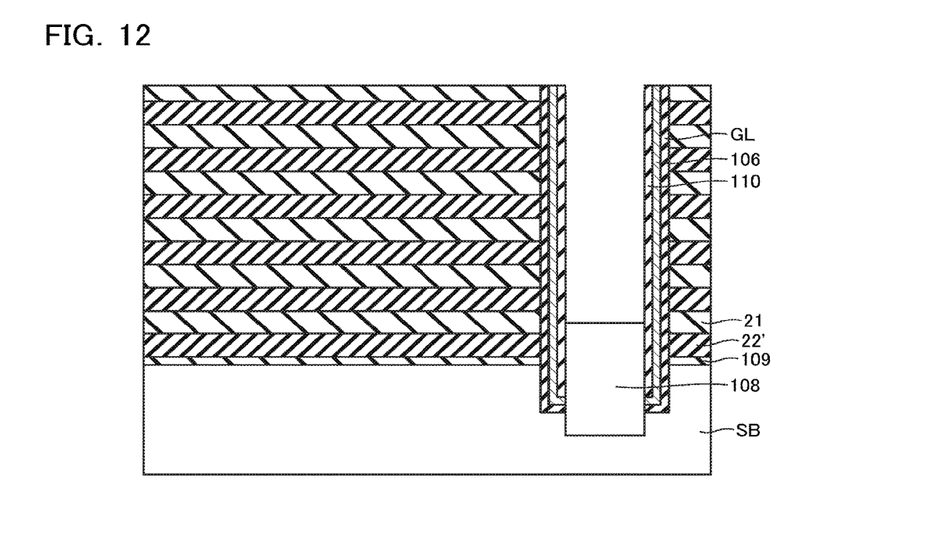
FIG. 12 is a process diagram illustrating the method of manufacturing the memory cell MC.

After the substrate SB is exposed by etching the bottom surface of the memory hole MH, as illustrated in FIG. 12, the epitaxial layer 108 is formed using a solid phase epitaxy method or similar method while the exposed substrate SB is used as a foundation layer. In the case where the first semiconductor layer 106 is amorphous silicon, a single crystalline film can also be formed by causing a solid phase growth of the first semiconductor layer 106 using this epitaxial layer 108 in a post-process. In this case, the temperature environment when the epitaxial layer 108 is formed is preferred to be equal to or less than 400° C. As just described, forming the epitaxial layer 108 after forming the first semiconductor layer 106 allows reducing the size of the opening area of the memory hole MH compared with the case where the epitaxial layer is formed before formation of the first semiconductor layer.

Figure 13:
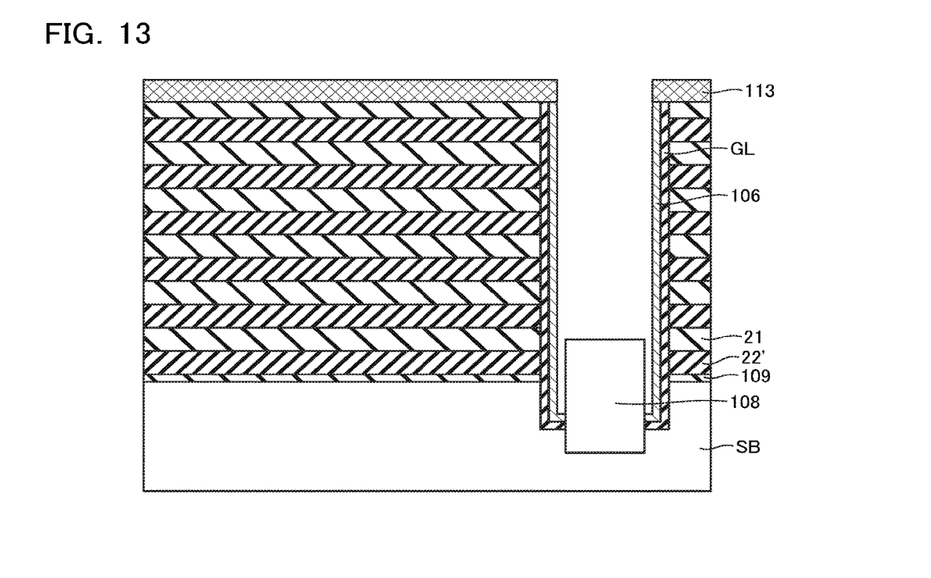
FIG. 13 is a process diagram illustrating the method of manufacturing the memory cell MC.
Figure 14:
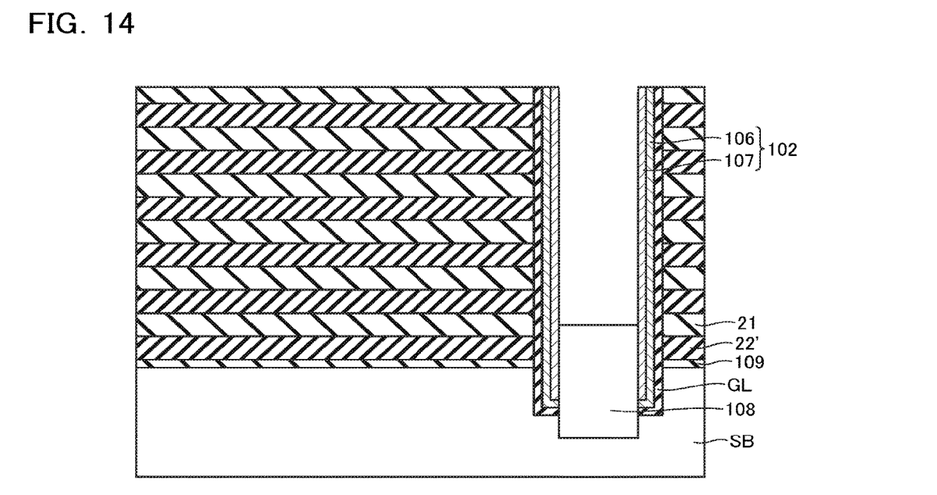
FIG. 14 is a process diagram illustrating the method of manufacturing the memory cell MC.

Subsequently, as illustrated in FIG. 13, a mask material 113 is formed on the laminated body again, and the cover film 110 alone is removed by etching. To remove the cover film 110, a hydrogen fluoride solution or similar solution is used in the case where the cover film 110 is an oxide film while a phosphoric acid solution or similar solution is used in the case where the cover film 110 is a nitride film. Subsequently, as illustrated in FIG. 14, the second semiconductor layer 107 is formed along the first semiconductor layer 106 to fill the gap between the epitaxial layer 108 and the first semiconductor layer 106. As just described, the semiconductor portion 102 in a columnar shape whose lower end is positioned between the top surface of the substrate SB and the lower end of the epitaxial layer 108 is obtained. Then, this semiconductor portion 102 in a columnar shape and the substrate SB are electrically coupled together via the epitaxial layer 108. Here, in this embodiment, the memory gate insulating layer GL is formed to intervene between the semiconductor portion 102 in a columnar shape and the substrate SB.

Figure 15:
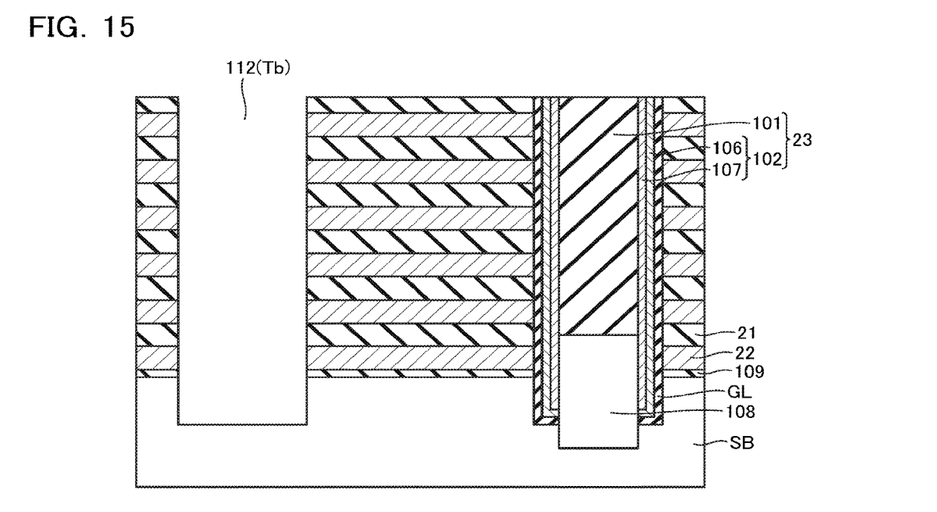
FIG. 15 is a process diagram illustrating the method of manufacturing the memory cell MC.

As illustrated in FIG. 15, the oxide-film core 101 is formed at the inner side of the second semiconductor layer 107 in a columnar shape. Subsequently, a through-hole 112 for forming the source contact LI is formed. The sacrifice films 22' of the laminated body is replaced by metal layers as conducting layers, using wet etching, dry etching or similar method. Subsequently, the interlayer insulating film 21' is deposited on the side surface of the through-hole 112 of the laminated body. Subsequently, a metal film made of tungsten or similar material is implanted to fill the through-hole 112, so as to form the source contact LI. Thus, the structure in FIG. 6 is completed.

[Method of Forming First Semiconductor Layer 106 and Second Semiconductor Layer 107]

Here, a description will be given of a method of forming the first semiconductor layer 106 and the second semiconductor layer 107.

Firstly, a description will be given of a method of forming the first semiconductor layer 106. As described above, the first semiconductor layer 106 can be formed from amorphous silicon or polysilicon, and is formed by, for example, a CVD method or similar method. The first semiconductor layer 106 can also be formed by a solid phase growth method. To form the first semiconductor layer 106 by a solid phase growth method, a film of amorphous silicon is formed on the memory gate insulating layer GL and then the epitaxial layer 108 is formed under a temperature environment equal to or less than 400° C. This allows maintaining the first semiconductor layer 106 in the amorphous state. Subsequently, after the cover film 110 is removed, the first semiconductor layer 106 undergoes annealing treatment. The annealing process described above causes a solid phase growth of the first semiconductor layer 106 in contact with the epitaxial layer 108 such that the first semiconductor layer 106 changes into a solid-phase growth layer as a single crystal. Single-crystal silicon has better crystallinity compared with polysilicon and amorphous silicon and improves the transfer rate of electrons, thus improving the current characteristics. As a result, the cell characteristics can be improved. Furthermore, at the time of removing the cover film 110 by etching, it is possible to also remove a naturally oxidized film generated on the surface of the first semiconductor layer 106 in the case where the first semiconductor layer 106 is exposed to external air. This allows preventing the two semiconductor layers 106 and 107 from being separated from each other due to the naturally oxidized film on the surface of the first semiconductor layer 106 after the second semiconductor layer 107 is formed on the first semiconductor layer 106 to obtain the semiconductor portion 102 in a columnar shape.

The following describes a method of forming the second semiconductor layer 107. Similarly to the first semiconductor layer 106, the second semiconductor layer 107 can employ silicon. For example, the second semiconductor layer 107 can be formed as a polysilicon film by a CVD method or similar method, similarly to the first semiconductor layer 106.

In the case where the first semiconductor layer 106 is a single-crystal silicon layer formed by a solid phase growth, the second semiconductor layer 107 can also be formed as a single-crystal or polycrystalline silicon film by a solid phase epitaxy method or a vapor phase epitaxy method while the first semiconductor layer 106 is used as a foundation layer.

In the case of formation using an epitaxy method, the second semiconductor layer 107 can be formed inside the vacuum device identical to the device used for forming the epitaxial layer 108. This reduces the generation of the naturally oxidized film caused by exposure of the semiconductor layer to external air.

In the case of formation using a method other than the epitaxy method, it is necessary to transfer the product to a device different from the device where the epitaxial layer 108 is formed. At this time, the product might be exposed to external air such that a naturally oxidized film is generated on the surface of the first semiconductor layer 106. To prevent this situation, it is preferred to perform the process for etching the surface of the first semiconductor layer 106 before forming the second semiconductor layer 107 so as to remove the naturally oxidized film.

The second semiconductor layer 107 can also employ silicon-germanium other than silicon. Silicon-germanium includes silicon mixed with germanium that is larger than silicon atoms so as to cause lattice expansion of silicon crystal (cause distortion). This increases the mobility of electrons, thus consequently achieving high-speed operation and reduction in power consumption. The forming method in the case where silicon-germanium is used is similar to that in the case where silicon is used.

As just described, the method of forming the first semiconductor layer 106 and the second semiconductor layer 107 can employ various combinations. Any of the combinations allows electrically coupling both the semiconductor layers together without causing a separating layer between the semiconductor layers due to the naturally oxidized film on the first semiconductor layer 106.

(Effects)

As described above, the embodiment allows obtaining a nonvolatile semiconductor memory device having a three-dimensional structure that does not cause deterioration in cell current and thus does not cause deterioration in cell characteristics.

[Charge Storage Layer]

As the material of the charge storage layer included in the memory layer 104, the silicon nitride film (SiN) is described in the above-described embodiment as an example. However, the following oxides can also be selected.

$SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO $AB_2O_4$ (However, A and B are identical or different elements, and, are one of Al, Sc, Ti, V, Cr, Mn, Fe, Co, Ni, Cu, Zn, Ga, and Ge. For example, $Fe_3O_4$, $FeAl_2O_4$, $Mn_{1|x}Al_{2\ x}O_{4|y}$, $Co_{1|x}Al_{2\ x}O_{4|y}$, and MnOx are employed.)

$ABO_3$ (However, A and B are identical or different elements, and, are one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $LaAlO_3$, $SrHfO_3$, $SrZrO_3$, and $SrTiO_3$ are employed.)

As the material of the charge storage layer, the following oxynitrides can also be selected.

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, and AlSiON Further, it is also possible to employ the materials obtained by replacing a part of the oxygen elements of the oxides described above by nitrogen elements. In particular, one insulating layer and a plurality of insulating layers are each preferred to be selected from the group consisting of $SiO_2$, SiN, $Si_3N_4$, $Al_2O_3$, SiON, $HfO_2$, HfSiON, $Ta_2O_5$, $TiO_2$, and $SrTiO_3$.

In particular, regarding silicon-based insulating films such as $SiO_2$, SiN, and SiON, the respective concentrations of the oxygen elements and the nitrogen elements can be set to be equal to or more than $1\times10^{18}$ atoms/cm$^3$. However, the barrier heights of the plurality of insulating layers are different from one another. The insulating layer can include a material including impurity atoms that forms a defect level or semiconductor/metal dots (the quantum dots).

[Comparative Embodiment]

Figure 16:
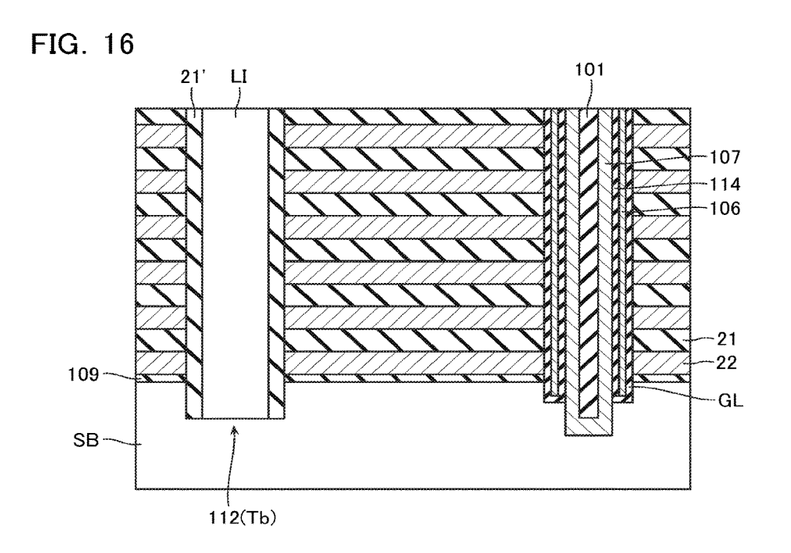
FIG. 16 is a diagram illustrating a comparative embodiment.

Lastly, a description will be given of a comparative embodiment using FIG. 16. A nonvolatile semiconductor memory device according to the comparative embodiment does not include the epitaxial layer, and the second semiconductor layer 107 extends under the surface of the substrate SB to make a contact with the substrate SB. At the interface with the first semiconductor layer 106, a separating layer (naturally oxidized film) 114 is generated so as to separate both the semiconductor layers from each other. This reduces the current characteristics and causes deterioration in cell characteristics in the nonvolatile semiconductor memory device according to the comparative embodiment, compared with this embodiment.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a substrate;
    a columnar semiconductor arranged to extend in a vertical direction with respect to the substrate, and having an inner surface with which an oxide film is in direct contact and a lower surface;
    a memory gate insulating layer arranged on an outer surface of the columnar semiconductor and in direct contact with the lower surface of the columnar semiconductor, the memory gate insulating layer including a charge storage layer;
    a laminated body arranged via the memory gate insulating layer around the columnar semiconductor, the laminated body including a conducting layer and an interlayer insulating layer that are alternately laminated on the substrate;
    an epitaxial layer arranged in direct contact with the inner surface of the columnar semiconductor and a lower surface of the oxide film, wherein the epitaxial layer is electrically coupled to each of the substrate and the columnar semiconductor, and
    the columnar semiconductor includes:
    a first semiconductor layer arranged along the memory gate insulating layer; and
    a second semiconductor layer arranged along the first semiconductor layer, the second semiconductor layer being in contact with the first semiconductor layer.

2. The nonvolatile semiconductor memory device according to claim 1, wherein
    the first semiconductor layer includes at least one of single-crystal silicon and polysilicon, and
    the second semiconductor layer includes at least one of polysilicon and silicon-germanium.

3. The nonvolatile semiconductor memory device according to claim 1, wherein
    the first semiconductor layer includes single-crystal silicon, and
    the second semiconductor layer includes at least one of single-crystal silicon and silicon-germanium.

4. The nonvolatile semiconductor memory device according to claim 1, wherein
    the epitaxial layer has a lower end positioned under a top surface of the substrate.

5. The nonvolatile semiconductor memory device according to claim 4, wherein
    the columnar semiconductor and the memory gate insulating layer have respective lower ends positioned between the top surface of the substrate and the lower end of the epitaxial layer.

* * * * *